United States Patent Office 3,036,914

Patented May 29, 1962

3,036,914

PHOTOPOLYMERIZABLE COMPOSITIONS AND ELEMENTS

Andrew Bradshaw Jennings, Wilmington, Del., assignor to E. I. du Pont de Nemours and Company, Wilmington, Del., a corporation of Delaware No Drawing. Filed Jan. 22, 1960, Ser. No. 3,993

10 Claims. (Cl. 96—84)

This invention relates to new photopolymerizable compositions, layers and elements. More particularly, it relates to photopolymerizable compositions which form flexible layers comprising a linear cellulosic polymer, a high molecular weight polyethylene oxide, an addition polymerizable ethylenically unsaturated compound, and an additional-polymerization initiator activatable by actinic light. This invention also relates to photopolymerizable elements bearing a layer of said photopolymerizable compositions and to a process for preparing printing reliefs therefrom.

Solid compositions capable of polymerization under the influence of actinic light to rigid, insoluble, tough polymer-containing structures are known. Compositions of this type are described in Plambeck U.S. Patents 2,760,863 and 2,791,504. Additional photopolymerizable compositions are described in the British patent specifications Nos. 741,470, 786,119, 802,853 and 807,-948. The compositions described in these references are particularly useful for the preparation of photopolymerizable printing plates. The prior compositions, however, are susceptible to variations in atmospheric conditions, and have a tendency to become brittle and crack upon aging, especially at low relative humidities and temperatures. It is therefore desirable to have printing plates which are flexible and are essentially free from brittleness after exposure so that the surface is smooth and is not easily damaged.

An object of this invention is to provide such compositions which are free from such disadvantages and form firm layers which are flexible and essentially free from brittleness after exposure to actinic light to form a polymer. Another object is to provide such plates (sold as photopolymer printing plates) which do not become brittle and crack or craze upon aging. A further object is to provide such plates which can be made on a commercial scale and result in high quality printing reliefs. Still further objects will be apparent from the following detailed description.

The photopolymerizable compositions, layers and elements provided by this invention comprise the following constituents:

(*a*) A compatible, addition-polymerizable, ethylenically unsaturated compound having a boiling point at normal pressure over 100° C., a molecular weight less than 1500 and containing one to four polymerizable ethylenic groups and capable of forming a high polymer by photoinitiated addition polymerization in the presence of an addition polymerization initiator therefor activatable by actinic light, (*b*) A small amount of a compatible, addition-polymerization initiator activatable by actinic light and not active thermally below 85° C.

(*c*) A mixture of polyethylene oxides having an average molecular weight of from about 100,000 to about 2,000,000, and (*d*) At least one essentially linear cellulose ester, preferably one containing free carboxylic acid or sulfonic acid groups or such groups neutralized by sodium, potassium or ammonium hydroxide.

The resulting composition forms good photopolymerizable layers which, prior to and subsequent to exposure, have solid surfaces and which after exposure are flexible and free from brittleness, especially at low temperature and low humidity.

If desired, the photopolymerizable compositions described above can also contain (*e*) A thermal addition polymerization inhibitor.

In the foregoing compositions the various constituents are used in ranges of parts by weight as follows:

(*a*) From 10 to 60 parts
(*b*) From 0.0001 to 6.0 parts
(*c*) From 2 to 25 parts
(*d*) From 40 to 90 parts
(*e*) From 0.001 to 6.0 parts The preferred photopolymerizable compositions contain as constituents (*a*) an acrylic acid ester of a diol of the formula $HO(CH_2CH_2O)_nH$ wherein *n* is a positive integer from 1 to 30. Mixtures of such compounds can be used, particularly diesters of mixtures of polyethylene glycol, wherein the average molecular weight of the precursor of the formula just recited is between 200 and 600.

Photopolymerizable elements can be made from the compositions in the same manners as described in the U.S. patents and British patent specifications referred to above.

The photopolymerizable elements provided by the invention have improved properties due to the presence of the polyethylene oxide having average molecular weight above 100,000. Photopolymerizable compositions are known containing polyethylene oxides of relatively low molecular weight, e.g., 1000 to 5000, but these elements do not have the enhanced flexibility which results from the use of the polyethylene oxide of average molecular weight greater than 100,000.

The photopolymerizable elements can be used to make photopolymerizable printing plates after the manner described in the U.S. patents and British patent specifications described above by exposure to actinic light through an image-bearing transparency or stencil.

This invention is further illustrated by but is not intended to be limited to the following examples.

*Example I*

A mixture of 113 g. of triethylene glycol diacrylate containing 0.01 percent by weight of anthraquinone and p-methoxyphenol, 354 g. of cellulose acetate succinate and 354 g. of water was milled for 5 minutes on a rubber mill at 105° C. At this time 63 g. of a high molecular weight polyethylene oxide with an average molecular weight of about 500,000 was added to the mixture on the mill. The milling was continued, and the temperature of the mill was lowered until the photopolymerizable composition stuck to one roll. The milling was continued for 10 more minutes before the composition was removed from the mill. The composition was pressed at 150° C. into a clear photopolymerizable layer 40 mils thick, and the layer was then laminated to a sheet steel base support 25 mils in thickness as described in Example 5 of assignee's Burg U.S. application Ser. No. 750,868, filed July 25, 1958. The resulting element was placed in a vacuum frame, and a line process photographic negative was brought into contact with the photopolymerizable surface. The vacuum frame containing the element and negative was placed beneath an 1,800 watt high-pressure mercury arc, and the photopolymerizable element was exposed to 1.75 watts of actinic radiation per square inch for 10 seconds. The unexposed areas were removed by spray washing at 16° C. for 8 minutes with an 0.08 N aqueous solution of NaOH. A sharp relief image was obtained which when tested on a rotary press gave at least one million satisfactory impressions. The element was conditioned at 15 percent relative humidity and 22° C. for 24 hours. The element was bent around a cylinder 6.6 inches in diameter, without the photopolymerized surface cracking. The printing element showed excellent image quality when used for printing on a rotary press.

*Example II*

Example I was repeated except that the preliminary mixture consisted of 204 g. of the triethylene glycol diacrylate described in Example I, 300 g. of cellulose acetate succinate and 300 g. of water. After milling for 5 minutes at 105° C., 100 g. of polyethylene oxide having an average molecular weight of about 100,000 was added to the mixture. A sharp relief image was obtained after exposure and washout of the unexposed areas. The element was conditioned as described in Example I. The element was bent around a cylinder 2.6 inches in diameter, without the photopolymerized surface cracking.

*Example III*

Example I was repeated except that the preliminary mixture consisted of 50 g. of triethylene glycol diacrylate, 70 g. of cellulose acetate succinate, 0.005 g. anthraquinone, 0.005 g. p-methoxyphenol and 72 ml. water. After milling for 5 minutes at 105° C., 30 g. of the high molecular weight polyethylene oxide described in Example I was added to the mixture. A satisfactory relief image was obtained after exposure and washout of the unexposed areas. The element was then conditioned as described in Example I. The element was bent around a cylinder 4.4 inches in diameter without the photopolymerized surface cracking.

*Example IV*

Example I was repeated except that the preliminary mixture consisted of 50 g. of the triethylene glycol diacrylate described in Example I, 95 g. of cellulose acetate succinate, and 95 ml. of water. After milling for 5 minutes at 105° C., 5 g. of polyethylene oxide described in Example I was added to the mixture. A satisfactory relief image was obtained after exposure and washout of the unexposed areas. The element was conditioned at 52 percent relative humidity and 24° C. for over 24 hours. The element was bent around a cylinder 5.5 inches in diameter without the photopolymerized surface cracking.

*Example V*

Example I was repeated except that the preliminary mixture consisted of 50 g. of polyethylene glycol diacrylate (average molecular weight of the diol precursor was 300), 0.005 g. of anthraquinone, 0.005 g. of p-methoxyphenol, 85 g. of cellulose acetate succinate and 85 ml. of water. After milling for 5 minutes at 105° C., 15 g. of the polyethylene oxide described in Example I was added to the mixture. A satisfactory relief image was obtained after processing. After conditioning as described in Example I, the element was bent around a cylinder 2.0 inches in diameter without the photopolymerized surface cracking.

*Example VI*

A mixture of 50 g. of triethylene glycol diacrylate, 85 g. of cellulose acetate succinate, 0.005 g. of anthraquinone, 0.005 g. of p-methoxyphenol and 85 ml. of water was milled for 10 minutes on a rubber mill at 105° C. Fifteen grams of the polyehylene oxide as described in Example II was then added to the mixture on the mill. The milling was continued and the temperature of the mill was lowered until the photopolymerizable composition stuck to one roll. The milling was continued for 5 more minutes, and the composition was removed from the mill. The composition was pressed at 105° C. into a clear, photopolymerizable layer, 30 mils in thickness, and the layer was laminated to a sheet of steel as described in Example 5 of assignee's Burg application, Serial No. 750,868, filed July 25, 1958. The element together with a line process photographic negative which had been placed over the element was placed in a vacuum frame beneath the radiation source described in Example I. The element was exposed to 1.75 watts of actinic radiation per square inch for 10 seconds. The unexposed areas were removed by spray washing at 16° C. for 7 minutes with an 0.08 N aqueous solution of NaOH. A satisfactory relief image was obtained and the printing element gave good results when used for printing on a rotary press. The element was conditioned as described in Example I. The results of the bending test were comparable to those obtained in Example I.

*Example VII*

Three hundred grams of cellulose acetate (containing 6% by weight volatiles), 170 g. of triethylene glycol diacrylate described in Example I and 300 ml. of water were mixed in the 5-quart pot of a planetary mixer, the blades of which were operated by an electric motor. The mixture was placed on a two-roll rubber mill internally heated to 105° C. by steam, the rolls of which are smooth cylinders six inches in diameter and ten inches in length, and was milled until most of the water was evaporated. Succinic anhydride (128 g.) and diethylcyclohexylamine (68.6 g.) were added and allowed to work into the mixture by milling for 20 minutes at 105° C. The polymer was removed from the mill and to a 127 g. portion was added 7 g. of the triethylene glycol diacrylate described above in this example, 15 g. of the polyethylene oxide described in Example I and 50 ml. of water. The composition was milled at 105° C. until most of the water was evaporated and the composition started to fall from the mill. The composition was then pressed and laminated as described in Example I using a 12-mil thick steel sheet for a base support. A sharp relief image was obtained after exposure and washout as described in Example I. The element was conditioned as described in Example I and was bent around a cylinder 5.5 inches in diameter without the photopolymerized surface cracking.

*Example VIII*

Example I was repeated except that the preliminary mixture consisted of 50 g. of triethylene glycol diacrylate, 0.005 g. of anthraquinone, 0.005 g. of p-methoxyphenol, 90 g. of cellulose acetate succinate and 85 ml. of water. After milling for 5 minutes at 105° C., 10 g. of a high molecular weight polyethylene oxide having an average molecular weight of 2 million was added to the mixture. A satisfactory relief image was obtained after processing as described in Example I. The element was conditioned as described in Example I and was then bent around a cylinder 6.8 inches in diameter without the photopolymerized surface cracking.

*Example IX*

Example I was repeated except that the preliminary mixture consisted of 50 g. of polyethylene glycol diacrylate (average molecular weight of the diol precursor was 300), 0.005 g. of anthraquinone, 0.005 g. of p-methoxyphenol, 95 g. of cellulose acetate succinate and 95 g. of water. After milling ror 7 minutes at 105° C., 5 g. of the polyethylene oxide described in Example I was added to the mixture on the mill. A satisfactory image was obtained after processing. The printing element gave good results when used for printing on a rotary press. After conditioning as described in Example I, the printing element was bent around a cylinder 4.8 inches in diameter without the photopolymerized surface cracking.

Suitable addition-polymerizable ethylenically unsaturated compounds (*a*), in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol dimethacrylate, triethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intraction dibasic acid unit, e.g., the diacrylate or dimethacrylate of $$HOCH_2CH_2OCH_2CH_2O\text{—}OCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

An addition polymerization initiator (*b*) activatable by actinic radiation and which is inactive thermally below 85° C. is added in amounts of from 0.0001 to 6 parts by weight, preferably 0.001 to 0.2 part by weight. Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alpha-hydrocarbon substituted aromatic acyloins including α-methylbenzoin, α-allylbenzoin and α-phenylbenzoin. Preferably, however, the photoinitiators are thermally inactive below 185° C. The anthraquinone photoinitiators fall within this range. In addition to anthraquinone other suitable initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

The polymeric constituents of the photopolymerizable composition comprise (*c*) polyethylene oxide having a molecular weight of from 100,000 to 2,000,000; and (*d*) at least one essentially linear cellulose ester polymeric compound, e.g., cellulose partial ester of a saturated monocarboxylic acid of 2 to 4 carbon atoms, e.g., cellulose acetate, cellulose acetate propionate, cellulose acetate butyrate, and derivatives of said cellulose ester, e.g., cellulose acetate succinate, cellulose acetate glutarate, cellulose acetate phthalate, etc.

A thermal addition polymerization inhibitor (*e*) is present in the preferred composition. Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil.

The novel photopolymerizable compositions are useful in the preparation of flexible, essentially non-brittle photopolymerizable printing elements comprising an adherent support having superposed thereon a solid layer of the just described photopolymerizable composition from 3 to 250 mils in thickness. The thickness of the photopolymerizable layer will vary according to the use. These thickness ranges are disclosed in Plambeck U.S. Patent 2,791,504, col. 3, lines 17 to 25.

The base or support for the photopolymerizable elements of this invention are preferably flexible and composed of metal, e.g., aluminum or steel, but they can be rigid. They also can be made of various film-forming resins or polymers. Suitable supports are disclosed in U.S. Patent 2,760,863, col. 5, lines 14 to 33. Various anchor layers as disclosed in this patent may be used to give strong adherence between the base and the photopolymerizable layer. The adhesive compositions disclosed in assignee's U.S. application of Burg, Serial No. 750,868, filed July 25, 1958, are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

To form the printing plate, the printing element is exposed to actinic light through a process transparency, e.g., a process negative or positive (an image-bearing transparency consisting solely of substantially opaque and substantially transparent areas where the opaque areas are substantially of the same optical density, the so-called line or halftone negative or positive).

The photopolymerizable elements may be exposed to actinic light from any source and of any type. The light source should, however, furnish an effective amount of ultraviolet radiation, since free-radical-generating addition-polymerization initiators activatable by actinic light generally exhibit their maximum sensitivity in this range. Suitable sources include carbon arcs, mercury-vapor arcs, fluorescent lamps with special ultraviolet-light-emitting phosphors, argon glow lamps, and photographic flood lamps. Of these, the mercury-vapor arcs, particularly the sunlamp type, and the fluorescent sunlamps, are most suitable. The sunlamp mercury-vapor arcs are customarily used at a distance of one and one-half to ten inches from the photopolymerizable layers.

The unexposed areas of the photopolymerized elements described herein are preferably removed by means of an aqueous solution. Suitable aqueous solutions include preferably alkali metal hydroxides, e.g., sodium and potassium, and in addition, ammonium, ammonium substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersion, spraying or brushing in removing the unpolymerized areas. In some instances organic solvents, e.g., acetone and methyl acetate are useful, for instance, when a cellulose partial ester of a saturated monocarboxylic acid is present. If desired, the inert inorganic or organic filler materials described in Plambeck U.S. Patent 2,760,863 or Patent 2,791,504 can be added.

The photopolymerizable compositions of the instant invention are useful in the preparation of printing reliefs which are flexible and essentially free from brittleness. The printing reliefs made in accordance with this invention can be used in all classes of printing but are particularly useful in those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted halftone. The plates are useful for multicolor printing.

The photopolymerizable compositions are also useful in the preparation of photoresists for etching, gravure, etc.; planographic plates; matrices for printing mattes; and screens for "silk screen" printing or as stencils. The compositions can be coated onto printing cylinders, e.g., plastic or metal cylinders.

The photopolymerizable compositions are suitable for other purposes, in addition to the printing uses described above, in which readily insolubilized, solid, addition polymerizable compositions are useful, e.g., as ornamental plaques or for producing ornamental effects; as patterns for automatic engraving machines, foundry molds, cutting and stamping dyes, name stamps, relief maps; for braille; as rapid cure coatings, e.g., on film base, inside tanks; as variable area and variable density sound tracks on film; for embossing plastics, paper, etc., e.g., with a die prepared from said photopolymerizable compositions; in the preparation of printed circuits; for affixing phosphors to surfaces to provide color television screens; and in the preparation of other plastic articles.

The printing reliefs obtained by the use of photopolymerizable elements of the invention having flexible supports, particularly those of the examples, are flexible and evidence excellent image quality when used for printing on rotary presses, and this is an advantage of the invention.

The printing reliefs are particularly advantageous because they are essentially free from brittleness after exposure to actinic light, especially at conditions of low relative humidity and temperature.. In addition, the printing reliefs are not affected by most printing inks and cleaning solutions.

What is claimed is:

1. A photopolymerizable composition comprising (*a*) an addition-polymerizable ethylenically unsaturated compound having a boiling point above 100° C. at normal pressure, a molecular weight less than 1500, containing 1 to 4 terminal ethylenic groups and being capable of forming a high polymer by photoinitiated addition polymerization in the presence of an addition polymerization initiator therefor activatable by actinic light, (*b*) an addition polymerization initiator activatable by actinic light and inactive thermally below 85° C., (*c*) a mixture of polyethylene oxides having an average molecular weight from about 100,000 to about 2,000,000, and (*d*) at least one essentially linear cellulose ester; said constituents (*a*), (*b*), (*c*) and (*d*) being present in the respective amounts of 10 to 60, 0.0001 to 6, 2 to 25 and 40 to 90 parts by weight.

2. A composition as defined in claim 1 wherein constituent (*a*) is an acyrlic acid diester of a mixture of polyethylene glycols of average molecular weight between 200 and 600.

3. A composition as defined in claim 1 wherein said constituent (*d*) is cellulose acetate.

4. A composition as defined in claim 1 wherein said constituent (*d*) is cellulose acetate succinate.

5. A photopolymerizable element comprising a support and a layer of a photopolymerizable composition comprising (*a*) an addition-polymerizable ethylenically unsaturated compound having a boiling point above 100° C. at normal pressure, a molecular weight less than 1500, containing 1 to 4 terminal ethylenic groups and being capable of forming a high polymer by photoinitiated addition polymerization in the presence of an addition polymerization initiator therefor activatable by actinic light, (*b*) an addition polymerization initiator activatable by actinic light and inactive thermally below 85° C., (*c*) a mixture of polyethylene oxides having an average molecular weight from about 100,000 to about 2,000,000 and (*d*) at least one essentially linear cellulose ester; said constituents (*a*), (*b*), (*c*) and (*d*) being present in the respective amounts of 10 to 60, 0.0001 to 6, 2 to 25, and 40 to 90 parts by weight.

6. An element as defined in claim 5 wherein constituent (*a*) is an acrylic acid diester of a mixture of polyethylene glycols of average molecular weight between 200 and 600.

7. An element as defined in claim 5 wherein said constituent (*d*) is cellulose acetate.

8. An element as defined in claim 5 wherein said constituent (*d*) is cellulose acetate succinate.

9. An element as defined in claim 5 which has antihalation material beneath the photopolymerizable layer.

10. An element as defined in claim 5 wherein the support is a sheet of metal.

References Cited in the file of this patent

UNITED STATES PATENTS

| | | |
|---|---|---|
| 2,757,089 | Moessen | July 31, 1956 |
| 2,927,023 | Martin | Mar. 1, 1960 |